US009871513B2

(12) United States Patent
Iwamizu et al.

(10) Patent No.: US 9,871,513 B2
(45) Date of Patent: Jan. 16, 2018

(54) SEMICONDUCTOR DEVICE (71) Applicant: FUJI ELECTRIC CO., LTD., Kawasaki-shi (JP)

(72) Inventors: Morio Iwamizu, Matsumoto (JP); Yasuki Yoshida, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/150,489

(22) Filed: May 10, 2016

(65) Prior Publication Data
US 2016/0365852 A1    Dec. 15, 2016

(30) Foreign Application Priority Data

Jun. 10, 2015   (JP) ................. 2015-117263

(51) Int. Cl.
*H03K 17/687* (2006.01)
*H03K 17/284* (2006.01)
*H02M 3/07* (2006.01)
*H02P 31/00* (2006.01)
*H03K 5/08* (2006.01)
(Continued)

(52) U.S. Cl.
CPC .......... *H03K 17/687* (2013.01); *H02M 3/07* (2013.01); *H02P 31/00* (2013.01); *H03K 5/08* (2013.01); *H03K 17/0822* (2013.01); *H03K 17/08122* (2013.01); *H03K 17/284* (2013.01); *H03K 2217/0081* (2013.01)

(58) Field of Classification Search
CPC .......... H02M 3/00; H02M 3/07; H02P 31/00; H03K 17/00; H03K 17/08122; H03K 17/0822; H03K 17/284; H03K 17/687; H03K 2217/00; H03K 2217/0081; H03K 5/00; H03K 5/08; H03K 17/04126; H03K 17/063; H03K 17/0826; H03K 17/601; H03K 2217/0036
USPC .......................................... 327/109
See application file for complete search history.

(56) References Cited

U.S. PATENT DOCUMENTS 5,541,799 A * 7/1996 Schmidt ............. H03K 17/0822
                                                          361/18
5,781,473 A    7/1998 Javanifard et al.
(Continued)

FOREIGN PATENT DOCUMENTS

EP    0735681 A2    10/1996
GB    2278025 A     11/1994
JP    H11-195971 A   7/1999

*Primary Examiner* — Lincoln Donovan
*Assistant Examiner* — David Mattison
(74) *Attorney, Agent, or Firm* — Rabin & Berdo, P.C.

(57) ABSTRACT

In activating a motor, a gate voltage with which a power semiconductor element may supply a rush current of the motor is generated by a charge pump circuit, when a certain time (time until the rush current ends) has elapsed after activating the motor, a timer circuit operates a gate clamp circuit, which reduces the gate voltage of the power semiconductor element to reduce the current-carrying capability of the power semiconductor element. Subsequently, when the motor has caused a short-circuit failure, the power semiconductor element, because its gate voltage is reduced by the gate clamp circuit in advance, supplies only a load short current corresponding to the reduced gate voltage. Accordingly, the heat generation due to the short-circuit current is also small and an increase in temperature is also suppressed.

11 Claims, 10 Drawing Sheets (51) Int. Cl.
*H03K 17/0812* (2006.01)
*H03K 17/082* (2006.01)

(56) References Cited

U.S. PATENT DOCUMENTS

| | | | |
|---|---|---|---|
| 9,195,255 B1* | 11/2015 | O'Keeffe | G05F 5/00 |
| 2002/0012216 A1* | 1/2002 | Ohshima | H03K 17/0822 361/93.1 |
| 2006/0267671 A1 | 11/2006 | Khan et al. | |
| 2011/0193541 A1* | 8/2011 | Nakahara | G05F 1/10 323/282 |
| 2012/0154022 A1* | 6/2012 | Cazzaniga | G11C 5/145 327/536 |
| 2014/0225652 A1* | 8/2014 | Wang | G11C 5/145 327/157 |

* cited by examiner

SEMICONDUCTOR DEVICE

CROSS-REFERENCE TO RELATED APPLICATION

This application is based upon and claims the benefit of priority of the prior Japanese Patent Application No. 2015-117263, filed on Jun. 10, 2015, the entire contents of which are incorporated herein by reference.

BACKGROUND OF THE INVENTION

1. Field of the Invention

The embodiments discussed herein relate to a semiconductor device including a power semiconductor element for controlling a motor or the like.

2. Background of the Related Art

Many motors and many semiconductor devices for switching-controlling them are mounted on an automobile. For such semiconductor devices, an improvement in the reliability associated with a reduction in size and an increase in environmental temperature is needed. For the purpose of achieving a reduction in size and higher reliability of the semiconductor device, one chip or one package of a power semiconductor element and a driver circuit for driving this power semiconductor element has been developed. The driver circuit includes a control circuit and a protection circuit for protecting the power semiconductor element. The protection circuit monitors an overheat state of the power semiconductor element, for example, and will notify, upon detecting the overheat state, the control circuit of this state. The control circuit will perform, upon notification of the overheat state of the power semiconductor element from the protection circuit, control for turning off the power semiconductor element, for example. The semiconductor device also includes an overcurrent limiting circuit which monitors the current flowing in the power semiconductor element. This overcurrent limiting circuit includes a circuit which indirectly detects the current flowing in the power semiconductor element and limits, when the detected current value exceeds a set overcurrent limit value, the current flowing in the power semiconductor element (e.g., see Japanese Laid-open Patent Publication No. 11-195971).

Here, in a semiconductor device which switching-controls an inductive load such as a motor, a rush current flows when the motor is activated. That is, if a power semiconductor element is turned on, the current starts to flow in the power semiconductor element and the motor. At this time, the current which initially flows results in a current having a larger current value than a current flowing during the steady operation and then the current gradually decreases and settles to a stable rated current. Here, the large current which flows prior to reaching this rated current is the rush current. Therefore, the power semiconductor element is, when it is turned on, controlled so as to be able to supply to the motor a current determined taking into consideration such a rush current.

If a load causes a short-circuit failure when it is being driven under the rated current, a current larger than at least the rush current will continue to flow in the power semiconductor element, and therefore the temperature of the power semiconductor element will abruptly rise. In this case, until the protection circuit detects an overheat state and starts protecting the power semiconductor element, the temperature of the power semiconductor element may rise to a temperature at which it is thermally destroyed. Moreover, the flowing of such a large current might cause the burnout of a wiring substrate and the malfunction or the like of a peripheral device due to a fluctuation of the power-supply voltage. Note that, also in the semiconductor device with a built-in overcurrent limiting circuit, the overcurrent limit value is set larger than the peak value of the rush current. Therefore, if the load is shorted, a current having a current value larger than the peak value of the rush current will continue to flow in the power semiconductor element. Also in this case, because the temperature of the power semiconductor element abruptly rises, the power semiconductor element has problems, such as being thermally destroyed due to an abrupt increase in temperature.

SUMMARY OF THE INVENTION

According to one aspect, there is provided a semiconductor device with a driver circuit for driving a power semiconductor element, the driver circuit including a gate clamp circuit which clamps the gate voltage of the power semiconductor element, and a timer circuit which starts counting when a current flows in the power semiconductor element, wherein the timer circuit operates the gate clamp circuit after a certain time from the start of counting so as to reduce current-carrying capability of the power semiconductor element.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, several embodiments will be described in detail with reference to the accompanying drawings, with a semiconductor power switch for driving an on-vehicle motor taken as an example. Note that, each embodiment may be implemented as a combination of a plurality of embodiments as long as it does not cause any contradiction. Moreover, in the following description, the same reference sign may be used for the name of a terminal, and the voltage, signal, and the like at this terminal.

Figure 1:
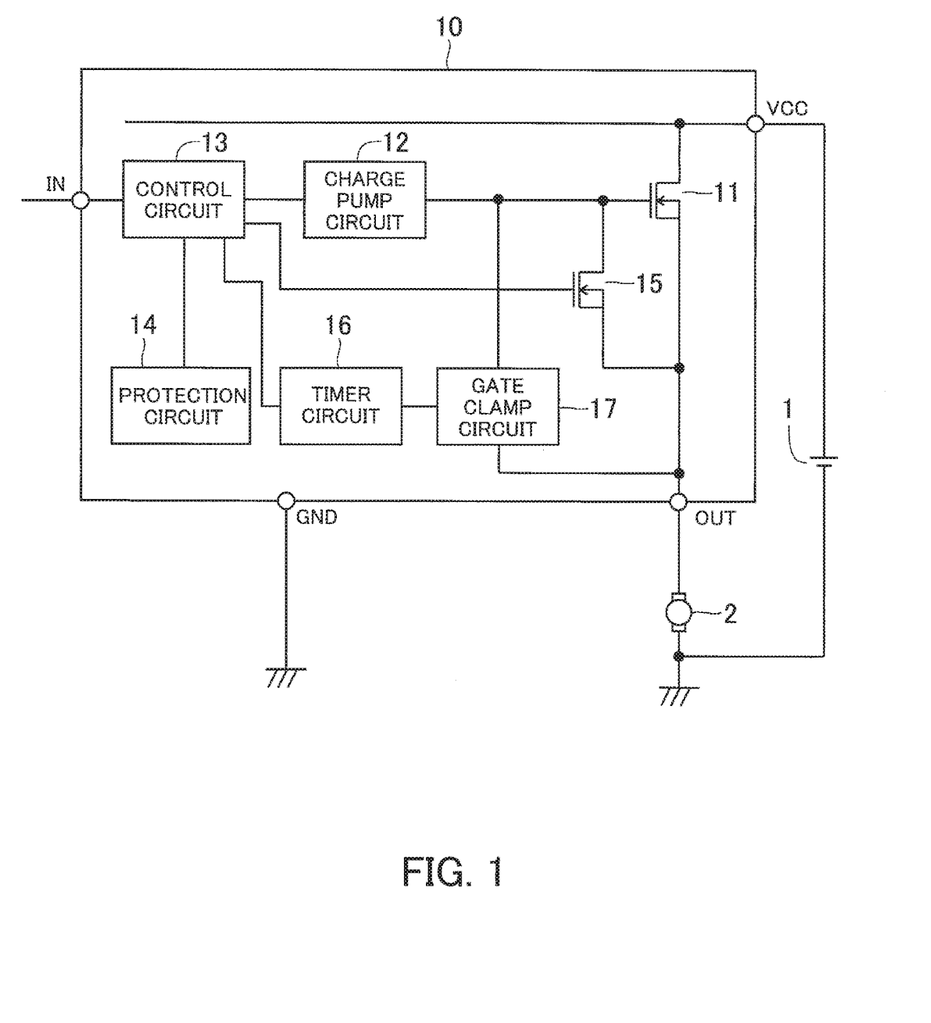
FIG. 1 is a circuit block diagram illustrating a semiconductor device according to a first embodiment.

FIG. 1 is a circuit block diagram illustrating a semiconductor device according to a first embodiment.

A semiconductor device 10 according to the first embodiment is an IPS (intelligent power switch) of one chip or one package of a power semiconductor element 11 for driving a motor and a driver circuit for driving the power semiconductor element 11. Because the semiconductor device 10 is arranged between the positive electrode terminal of a power supply 1 and a motor 2, it is called a high-side IPS.

In the semiconductor device 10, a power MOSFET (Metal-Oxide-Semiconductor Field-Effect Transistor) is used for the power semiconductor element 11, but not limited to this power MOSFET. For example, another power device such as an IGBT (Insulated Gate Bipolar Transistor) may be used for the power semiconductor element 11.

The drain of the power semiconductor element 11 is connected to a terminal VCC to which the positive electrode terminal of the power supply 1 that is an on-vehicle battery is connected, and the source is connected to a terminal OUT to which the motor 2 is connected. The gate of the power semiconductor element 11 is connected to the output of a charge pump circuit 12 for boosting the gate voltage, the input of the charge pump circuit 12 with reference to the potential of a terminal GND is connected to the output of a control circuit 13 with reference to the potential of the terminal GND, and the input of the control circuit 13 is connected to a terminal IN. The control circuit 13 is also connected to a protection circuit 14 with reference to the potential of the terminal GND (or internal GND). The protection circuit 14 detects, for example, whether or not the power semiconductor element 11 is in an overheat state or whether or not the power-supply voltage at the terminal VCC has dropped, and will notify, upon detection of such a state, the control circuit 13 of this state. The power semiconductor element 11 may be turned on when a voltage equal to or greater than a predetermined voltage (threshold voltage) is applied to the gate with respect to the potential of the terminal OUT. Accordingly, the output voltage of the charge pump circuit 12 is set taking into consideration the potential of the terminal OUT. Moreover, the internal GND is generated from a power supply line of the voltage VCC (not illustrated). The potential of the internal GND is lower than the power supply VCC (e.g., 12 V) by a predetermined voltage (e.g., 5 V).

The control circuit 13 is further connected to the gate of an extracting MOSFET 15 and to the input of a timer circuit 16. The extracting MOSFET 15, which has a drain and source connected to the gate and source of the power semiconductor element 11, respectively, is for extracting the electric charge charged in the gate capacitance of the power semiconductor element 11 when the power semiconductor element 11 is turned off, and thereby reducing the switching time.

The output of the timer circuit 16 is connected to the input of a gate clamp circuit 17, and the output of the gate clamp circuit 17 is connected to the gate of the power semiconductor element 11. When a signal to turn on the power semiconductor element 11 is input at a terminal IN serving as the input of the control circuit 13, the timer circuit 16 starts counting and then outputs, after a certain time (rush current conducting time), a signal to operate the gate clamp circuit 17. Upon receipt of the signal from the timer circuit 16, the gate clamp circuit clamps the gate voltage of the power semiconductor element 11 to reduce the current-carrying capability of the power semiconductor element 11.

Note that, because the timer circuit 16 operates with reference to the potential of the terminal GND (or internal GND) and the gate clamp circuit 17 operates with reference to the potential of the terminal OUT, signaling from the timer circuit 16 to the gate clamp circuit 17 is performed via a level shift circuit. Moreover, the terminal GND of the semiconductor device 10 is connected to the body of a vehicle.

Figure 2:
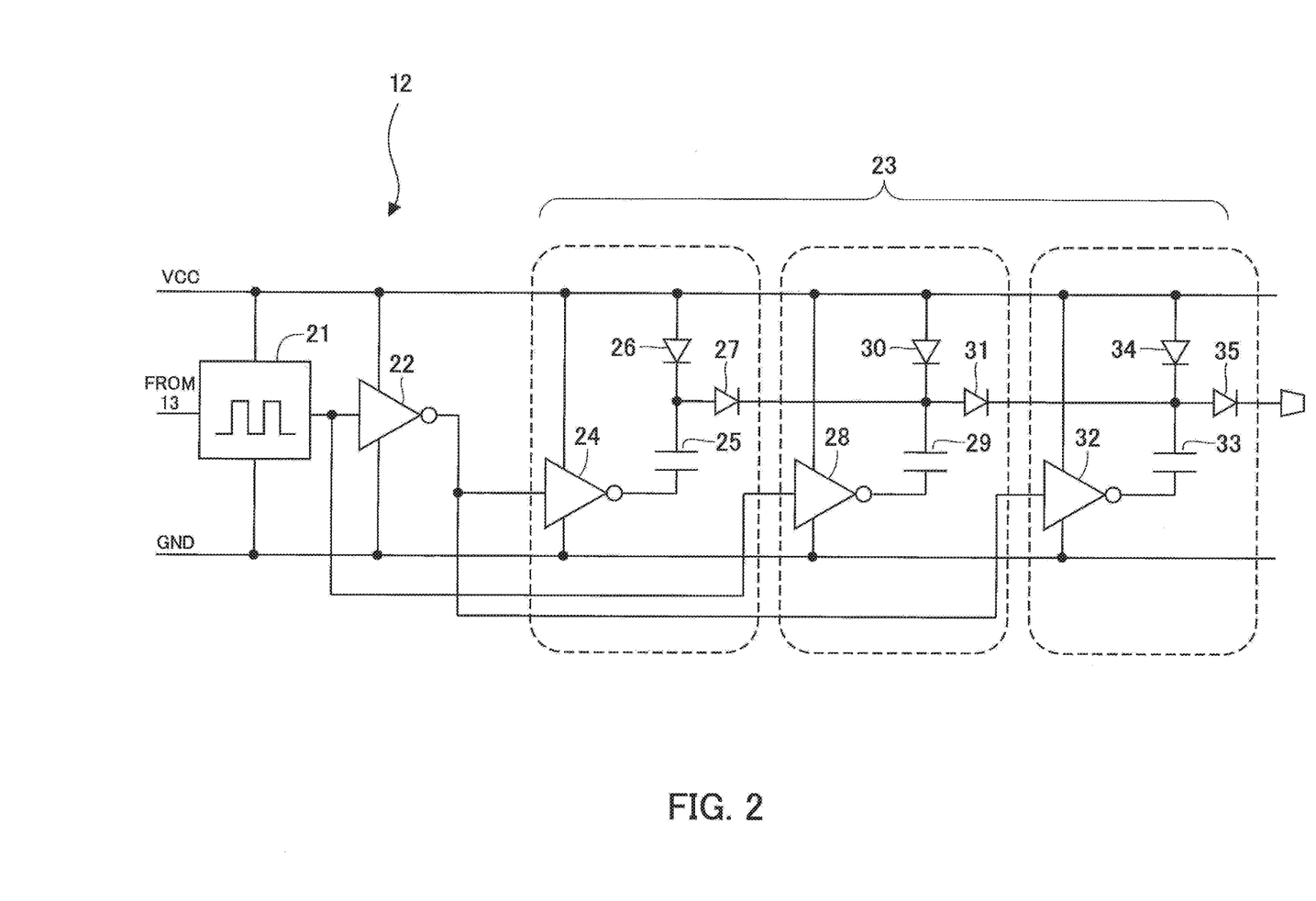
FIG. 2 is a circuit diagram illustrating a configuration example of a charge pump circuit of the semiconductor device according to the first embodiment.

FIG. 2 is the circuit diagram illustrating a configuration example of the charge pump circuit of the semiconductor device according to the first embodiment.

The charge pump circuit 12 includes an oscillation circuit (oscillator) 21 which oscillates based on a signal output from the control circuit 13, an inverter 22 which logically inverts a signal oscillated by the oscillation circuit 21, and a booster circuit (multi-stage booster section) 23 configured in three stages, for example.

The oscillation circuit 21 receives from the control circuit 13 a logic signal to turn on or off the power semiconductor element 11, and performs, only upon receipt of an activation signal to turn on the power semiconductor element 11, the oscillation operation to output an oscillation signal.

The inverter 22 inverts and outputs the oscillation signal output from the oscillation circuit 21.

In the booster circuit 23, the first stage includes an inverter 24, a capacitor 25, and two diodes 26 and 27, the second stage includes an inverter 28, a capacitor 29, and two diodes 30 and 31, and the third stage includes an inverter 32, a capacitor 33, and two diodes 34 and 35.

The input of the inverter 24 of the first stage is connected to the output of the inverter 22, the output of the inverter 24 is connected to one terminal of the capacitor 25, and the other terminal of the capacitor 25 is connected to the cathode of the diode 26 and the anode of the diode 27. The anode of the diode 26 is connected to the power supply line of the voltage VCC. The power supply line of the voltage VCC is connected to the terminal VCC of the semiconductor device 10.

The input of the inverter 28 of the second stage is connected to the output of the oscillation circuit 21, the output of the inverter 28 is connected to one terminal of the capacitor 29, and the other terminal of the capacitor 29 is connected to the cathode of the diode 30, the anode of the diode 31, and the cathode of the diode 27 of the first stage. The anode of the diode 30 is connected to the power supply line of the voltage VCC.

The input of the inverter 32 of the third stage is connected to the output of the inverter 22, the output of the inverter 32 is connected to one terminal of the capacitor 33, and the other terminal of the capacitor 33 is connected to the cathode of diode 34 and the anode of the diode 35. The anode of the diode 34 is connected to the power supply line of the voltage VCC, and the cathode of the diode 35 constitutes the output of the charge pump circuit 12.

In the charge pump circuit 12 having the above configuration, the oscillation circuit 21 starts oscillating upon receipt of the activation signal of the power semiconductor element 11 from the control circuit 13. When the signal output from the oscillation circuit 21 is at an L (low) level, for example, this signal is inverted to an H (high) level by the inverter 22, and is input to the inverter 24 of the first stage of the booster circuit 23. Thus, the output of the inverter 24 becomes an L level, so that one terminal of the capacitor 25 is connected to the ground GND and the capacitor 25 is charged with the voltage VCC of the power supply line via the diode 26. As the result, the terminal voltage of the capacitor 25 becomes VCC−Vf (Vf is a forward voltage of the diode 26).

When the signal output from the oscillation circuit 21 becomes an H level, this signal is inverted to an L level by the inverter 22, and is input to the inverter 24 of the first stage of the booster circuit 23. Thus, the output of the inverter 24 becomes an H level, so that the voltage VCC of the power supply line is applied to one terminal of the capacitor 25 and as the result the voltage of the other terminal of the capacitor 25 becomes 2VCC−Vf. At this time, because the signal of an H level is input to the inverter 28 of the second stage of the booster circuit 23, the output of the inverter 28 becomes an L level. Thus, one terminal of the capacitor 29 is connected to the ground GND and the voltage of 2VCC−Vf is applied to the other terminal of the capacitor 29 via the diode 27 of the first stage. As the result, the terminal voltage of the capacitor 29 becomes 2VCC−2Vf (Vf is a forward voltage of each of the diodes 26 and 27, and it is assumed that Vf of the diode 26 and Vf of the diode 27 have the same value).

Next, when the signal output from the oscillation circuit 21 becomes an L level, this signal is input to the inverter 28 of the second stage to set the output of the inverter 28 to an H level, i.e., the voltage VCC of the power supply line. As the result, the voltage of the other terminal of the capacitor 29 becomes 3VCC−2Vf because the voltage of 2VCC−2Vf is overlapped on VCC. At this time, because the signal of an H level is input to the inverter 32 of the third stage of the booster circuit 23, the output of the inverter 32 becomes an L level. Thus, one terminal of the capacitor 33 is connected to the ground GND and the voltage of 3VCC−2Vf is applied to the other terminal of the capacitor 33 via the diode 31 of the second stage. As the result, the terminal voltage of the capacitor 33 becomes 3VCC−3Vf (Vf is a forward voltage of each of the diodes 26, 27, and 31, and it is assumed that Vf of the diode 26, Vf of the diode 27 and Vf of the diode have the same value). The voltage boosted in this manner is output to the output of the charge pump circuit via the diode 35. This output signal will be continuously obtained because the L level and H level of the signal output from the oscillation circuit 21 are alternately repeated, and serves as the gate voltage of the power semiconductor element 11.

Figure 3:
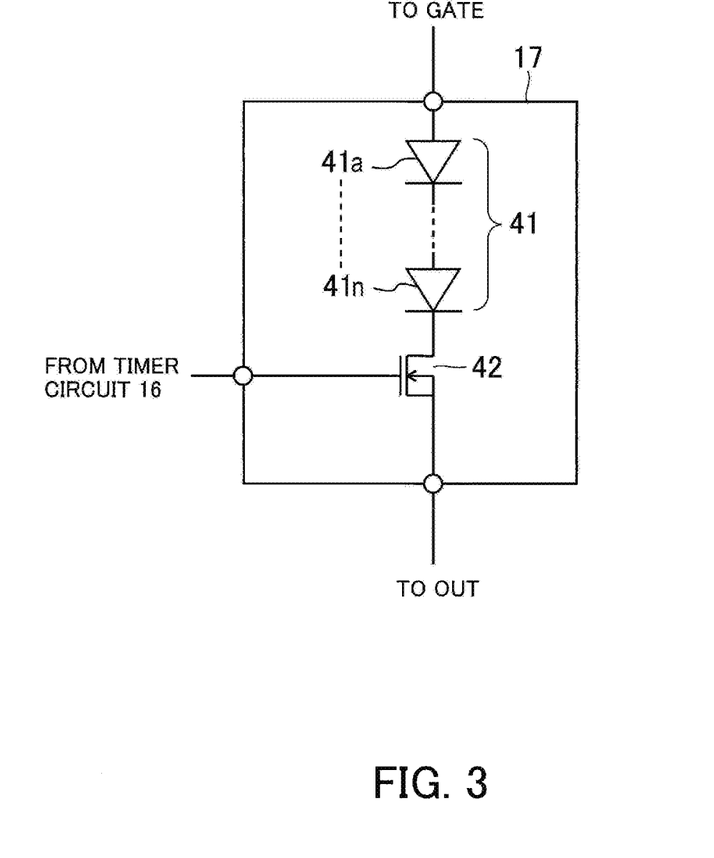
FIG. 3 is a circuit diagram illustrating a configuration example of a gate clamp circuit of the semiconductor device according to the first embodiment.

FIG. 3 is the circuit diagram illustrating a configuration example of the gate clamp circuit of the semiconductor device according to the first embodiment.

The gate clamp circuit 17 includes a diode group 41 and a MOSFET 42. The diode group 41 is constituted by serial connection of a plurality of diodes 41a-41n. The anode of the diode group 41 is connected to the gate of the power semiconductor element 11, and the cathode of the diode group 41 is connected to the drain of the MOSFET 42. The gate of the MOSFET 42 is connected to the output of the timer circuit 16, and the source of the MOSFET 42 is connected to the terminal OUT of the semiconductor device 10.

In the gate clamp circuit 17, when the signal of an L level indicating that the time is being counted is input from the timer circuit 16, the MOSFET 42 is turned off. Therefore, the gate voltage of the power semiconductor element 11 is kept at a voltage value that allows flowing of a current equal to or greater than the rush current of the motor 2. When the signal of an H level indicating that the time is up is input from the timer circuit 16, the MOSFET 42 is turned on, and the gate voltage of the power semiconductor element 11 is reduced to a value equal to a sum of the respective forward voltages of the diodes constituting the diode group 41. This voltage is a gate voltage that allows flowing of the current needed for the operation after the motor 2 is activated, and the value of this voltage is adjusted in accordance with the number of diodes constituting the diode group 41. For example, assume that the voltage, which is applied to the gate of the power semiconductor element 11 when the motor 2 is activated, is set to a value higher by approximately 10 volts with reference to the potential of the terminal OUT. Moreover, also assume that after the motor 2 is activated, the gate clamp circuit 17 clamps the voltage applied to the gate of the power semiconductor element 11 to approximately 4 volts. In this case, if the forward voltage of each of the diodes constituting the diode group 41 is 0.7 volts and the voltage drop due to the on-resistance of the MOSFET 42 is 0.5 volts, the diode group 41 will be constituted by five diodes.

Next, the operation of the semiconductor device 10 will be described with reference to FIGS. 4 to 6.

Figure 4:
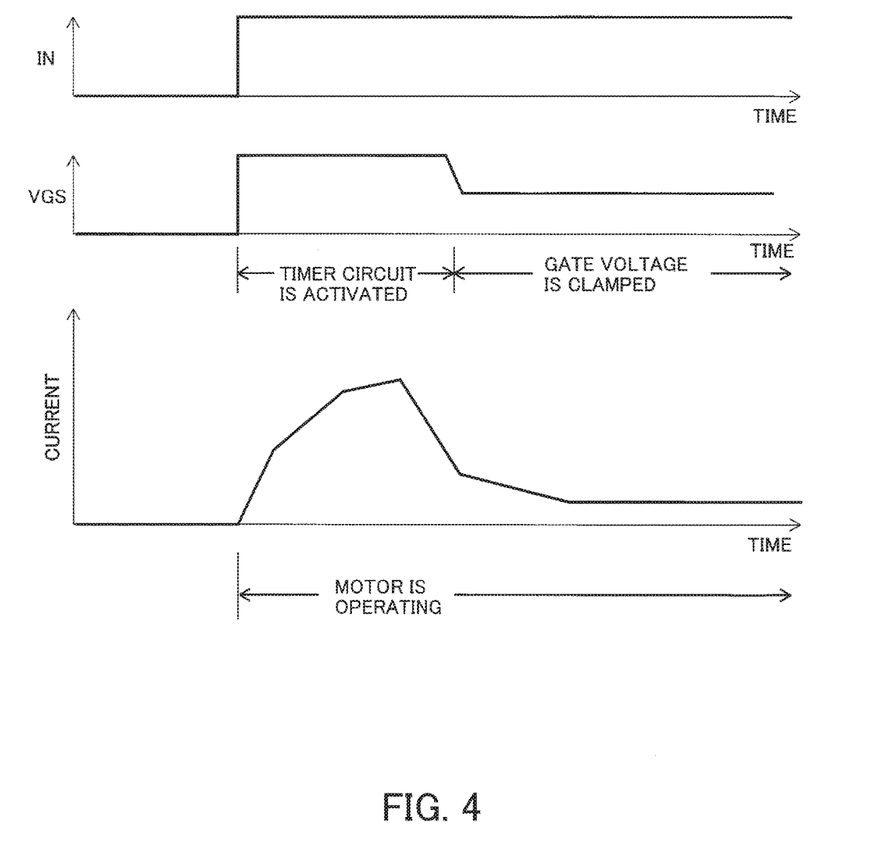
FIG. 4 illustrates operation waveforms when a motor is operating.
Figure 5:
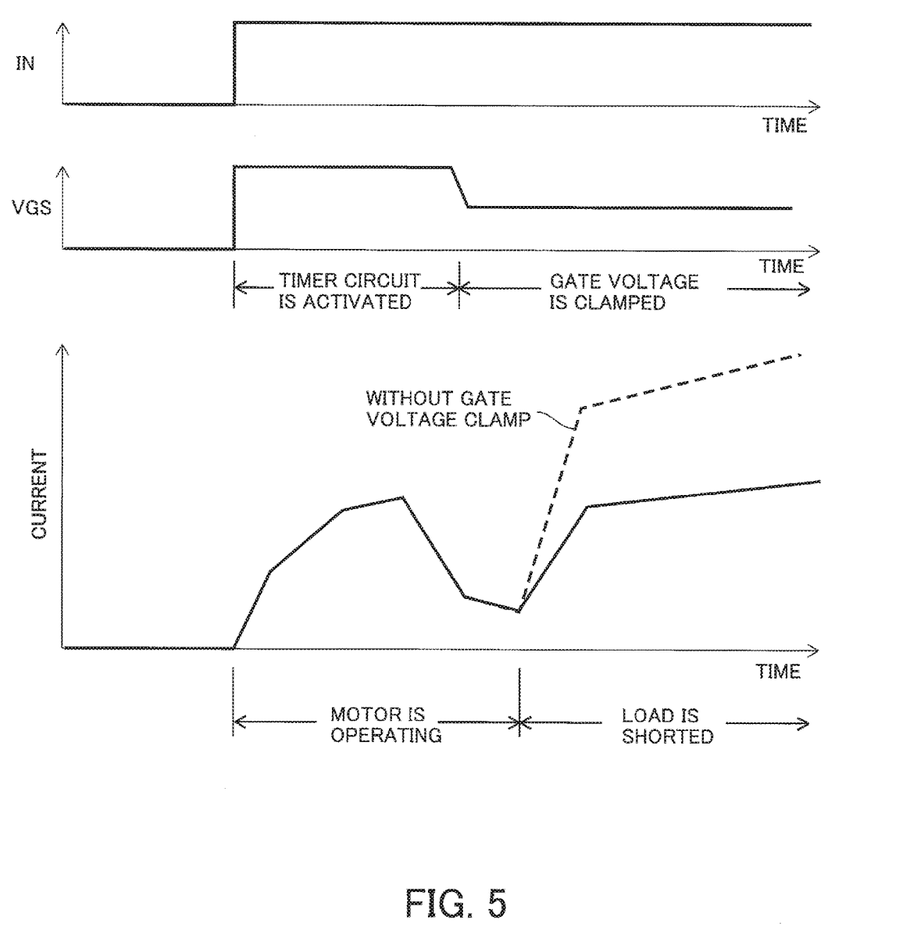
FIG. 5 illustrates operation waveforms when a load is shorted when the motor is operating.
Figure 6:
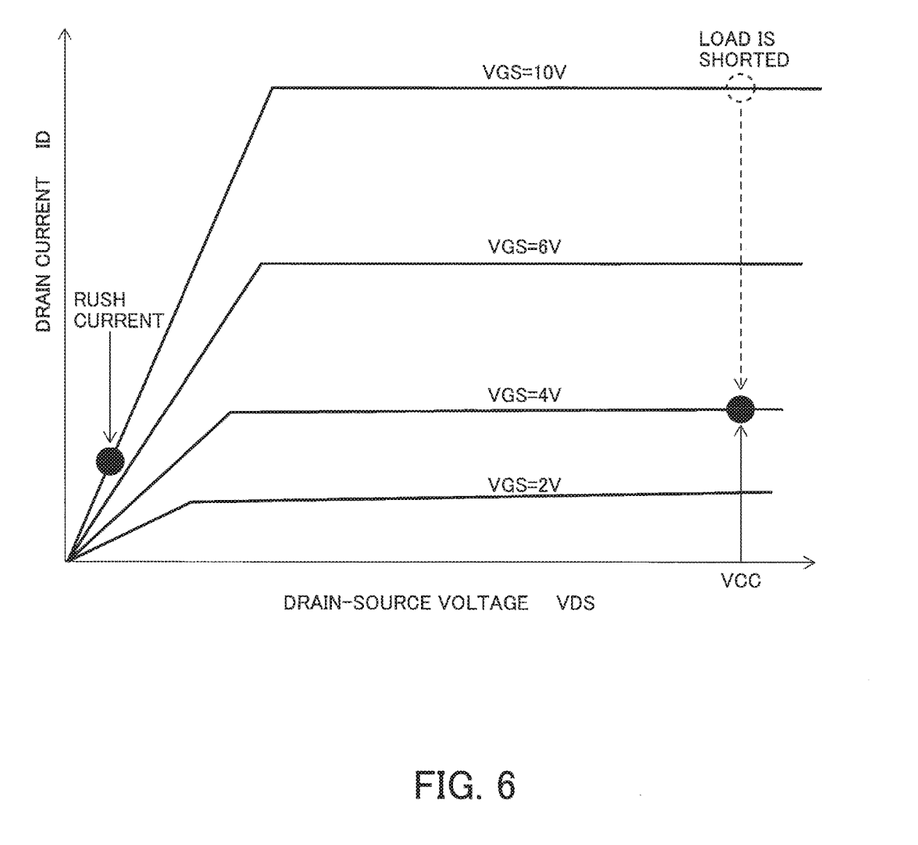
FIG. 6 illustrates an example of the static characteristic of a power MOSFET.

FIG. 4 illustrates the operation waveforms when a motor is operating, FIG. 5 illustrates the operation waveforms when a load is shorted when the motor is operating, and FIG. 6 illustrates an example of the static characteristic of the power MOSFET.

First, during the normal operation, as illustrated in FIG. 4, when the signal IN of an H level is applied to the terminal IN, the control circuit 13 and charge pump circuit 12 operate to generate a gate-source voltage VGS of the power semiconductor element 11 and at the same time the timer circuit 16 is activated. The gate-source voltage VGS at this time is 10 volts in the example of FIG. 6.

Upon application of the gate-source voltage VGS to the gate of the power semiconductor element 11, the power semiconductor element 11 is turned on and the motor 2 is activated. At this time, a rush current when the motor 2 is activated flows in the power semiconductor element 11 and then this current gradually decreases and settles to a stable rated current.

After a certain time (the time period until the rush current ends) has elapsed since activating the timer circuit 16, the gate clamp circuit 17 will operate to reduce the gate-source voltage VGS of the power semiconductor element 11 and thereafter keep the reduced gate-source voltage VGS. The gate-source voltage VGS at this time is 4 volts in the example of FIG. 6.

Next, a case will be described where a load is shorted when the motor 2 has been activated and is normally operating. At the time point when the load is shorted, the gate-source voltage VGS of the power semiconductor element 11 has been already reduced by the gate clamp circuit 17 and the current-carrying capability of the power semiconductor element 11 has been already reduced, and therefore the load short current will be also reduced to a value corresponding to this current-carrying capability. That is, as illustrated in FIG. 6, when the drain-source voltage VDS of the power semiconductor element 11 becomes the voltage VCC of the power supply 1 due to the short-circuit of the load, the drain current (short-circuit current) flows at the maximum up to the saturation current when the gate-source voltage VGS is 4 volts. Because this current is significantly reduced as compared with the saturation current (indicated by the round mark of a dashed line of FIG. 6) when the gate-source voltage VGS is not reduced, a sudden increase in the short-circuit current due to the short-circuit of the load is small and the heat generation of the power semiconductor element 11 due to the short-circuit current is also reduced. This situation may be also seen in FIG. 5 illustrating a change in the current, and the current when a load is shorted is significantly reduced as compared with a case where the gate voltage is not clamped (indicated by a dashed line).

The gate voltage of the power semiconductor element 11 is reduced in this manner after the rush current of the motor 2 flows, so that even if a load is shorted, only a current specified by the reduced gate voltage will flow as the short-circuit current. Accordingly, the heat generation due to the short-circuit current is small and thus the power semiconductor element is protected from the thermal destruction due to an abrupt increase in temperature.

Note that, in the semiconductor device 10 according to the first embodiment, the reduction of the gate-source voltage VGS is continuous as illustrated in FIGS. 4 and 5, but the gate-source voltage VGS may be reduced in stages.

Figure 7:
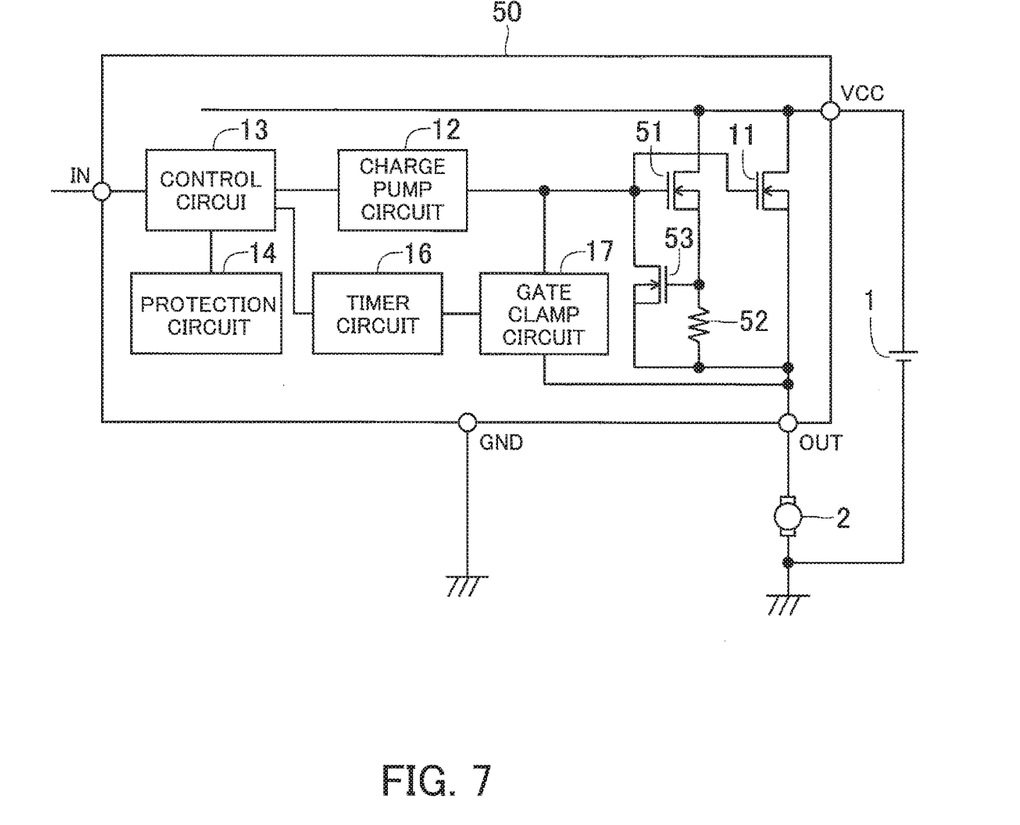
FIG. 7 is a circuit block diagram illustrating a semiconductor device according to a second embodiment.

FIG. 7 is a circuit block diagram illustrating a semiconductor device according to a second embodiment. Note that, in this FIG. 7, a component equal to or similar to the component illustrated in FIG. 1 is given the same reference sign to omit the detailed description thereof.

A semiconductor device 50 according to the second embodiment is a high-side IPS provided with a current limiting circuit. That is, the current limiting circuit includes a MOSFET 51 for current sense, a resistor 52, and a MOSFET 53 for gate-voltage reduction.

The drain of the MOSFET 51 is connected to the terminal VCC, the source of the MOSFET 51 is connected to one terminal of the resistor 52, and the other terminal of the resistor 52 is connected to the terminal OUT. The gate of the MOSFET 51 is connected to the output of the charge pump circuit 12. The connection point between the source of the MOSFET 51 and the resistor 52 is connected to the gate of the MOSFET 53, the drain of the MOSFET 53 is connected to the gate of the MOSFET 51, and the source of the MOSFET 53 is connected to the terminal OUT.

In the semiconductor device 50, when the power semiconductor element 11 is turned on by the output of the charge pump circuit 12, the MOSFET 51 is also turned on. At this time, a current corresponding to the current flowing in the power semiconductor element 11 flows in the MOSFET 51 and this current is converted to a voltage by flowing in the resistor 52 and then this voltage is applied to the gate of the MOSFET 53.

Here, if an overcurrent flows in the power semiconductor element 11, a current proportional to the overcurrent will flow also in the MOSFET 51, and a thus generated terminal voltage of the resistor 52 is applied to the gate of the MOSFET 53 to turn on the MOSFET 53. When the MOSFET 53 is turned on, the gate-source voltage VGS of the power semiconductor element 11 is reduced to reduce the drain current of the power semiconductor element 11. Note that, the overcurrent limit value when the MOSFET 53 is turned on is set by the value of the resistor 52, and is set to, for example, a value between the peak value of the rush current of the motor 2 and the drain current value when a load is shorted.

Also in the semiconductor device 50, as with the semiconductor device 10, when the power semiconductor element 11 is turned on, the timer circuit 16 is activated, and then when the time of the timer circuit 16 is up, the gate clamp circuit 17 is activated to reduce the gate voltage of the power semiconductor element 11. Thus, the semiconductor device 50 may suppress the short-circuit current and suppress the heat generation due to the short-circuit of the load without impairing any activating characteristics of the motor 2 in the event of short circuit.

Figure 8:
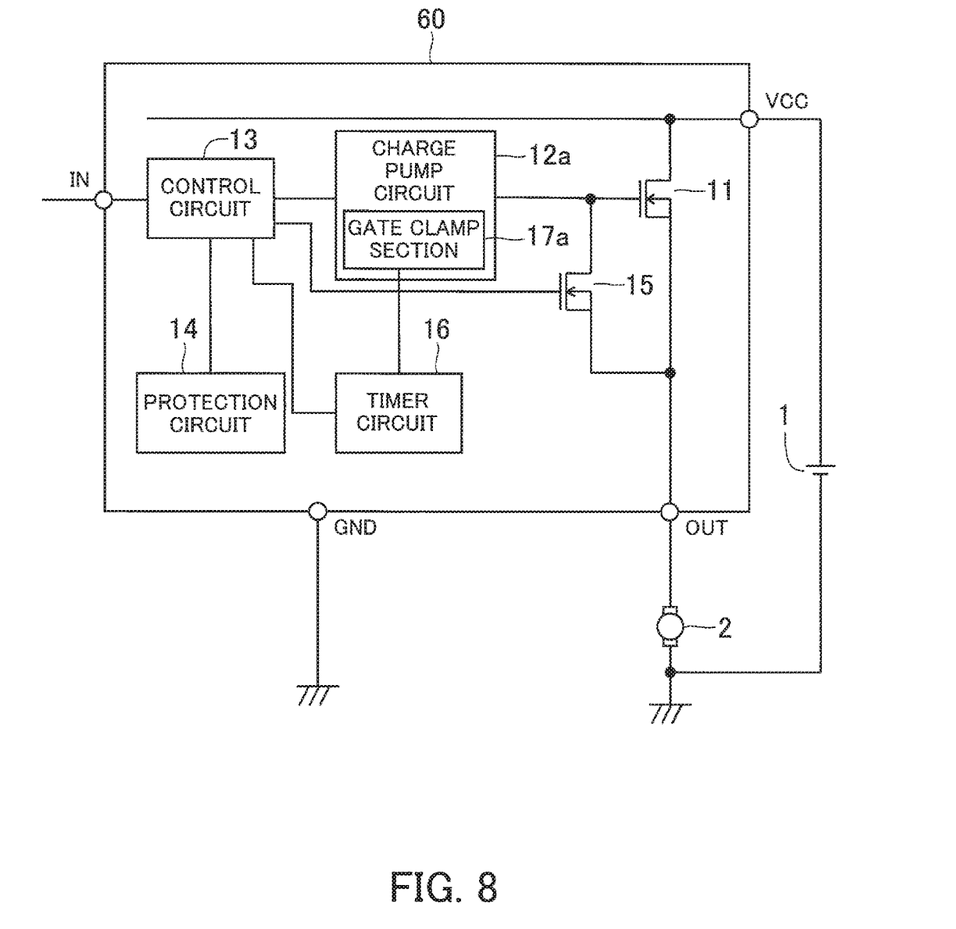
FIG. 8 is a circuit block diagram illustrating a semiconductor device according to a third embodiment.
Figure 9:
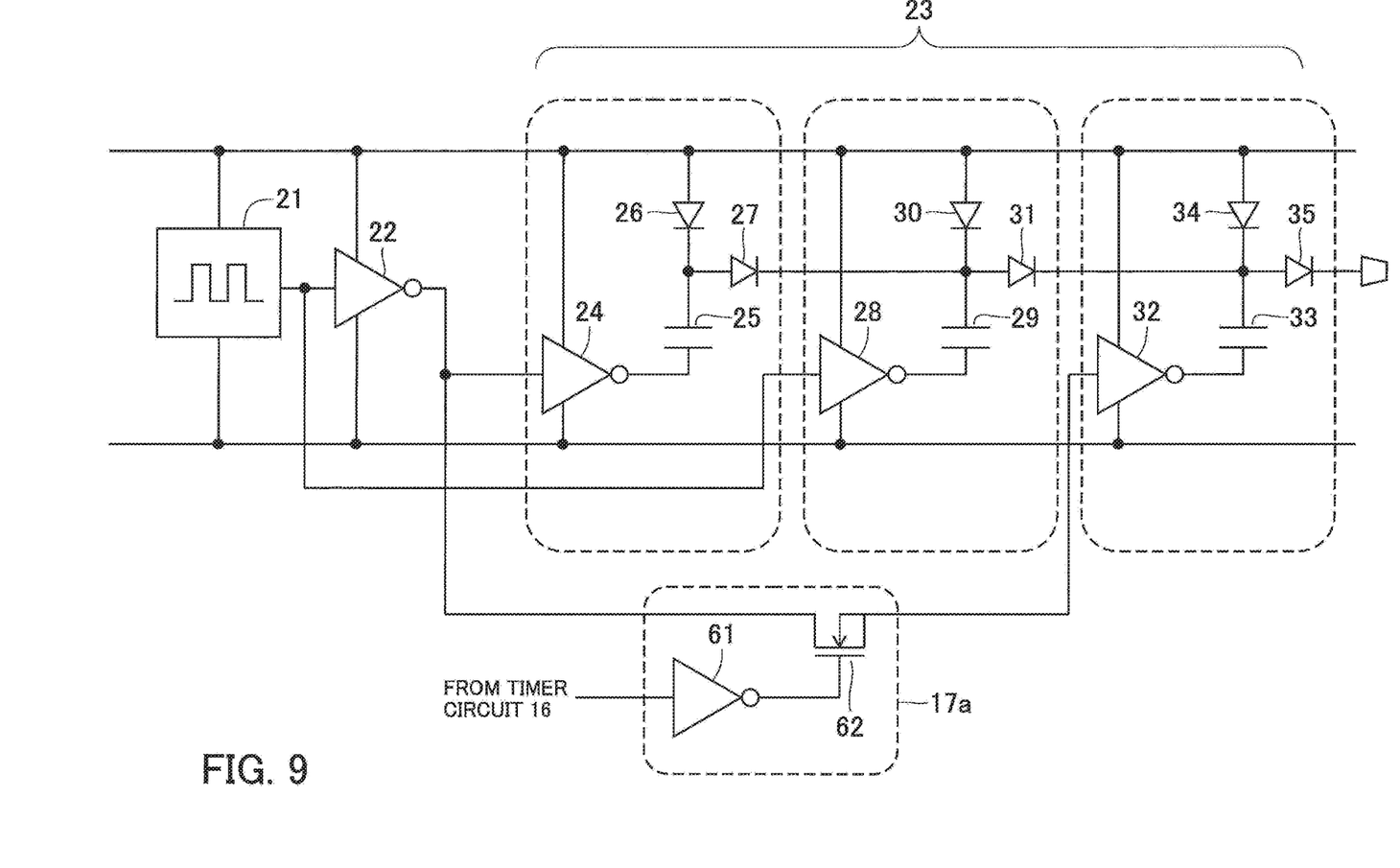
FIG. 9 is a circuit diagram illustrating a configuration example of a charge pump circuit of the semiconductor device according to the third embodiment.

FIG. 8 is a circuit block diagram illustrating a semiconductor device according to a third embodiment, and FIG. 9 is a circuit diagram illustrating a configuration example of a charge pump circuit of the semiconductor device according to the third embodiment. Note that, in FIGS. 8 and 9, a component equal to or similar to the component illustrated in FIGS. 1 and 2 is given the same reference sign to omit the detailed description thereof.

A semiconductor device 60 according to the third embodiment, as compared with the semiconductor device 10 according to the first embodiment, is changed so that the function of the gate clamp circuit 17 of the semiconductor device 10 is assigned to a charge pump circuit 12a. That is, the charge pump circuit 12a includes a gate clamp section 17a, and reduces, upon receipt of a signal from the timer circuit 16, the capability of the charge pump to reduce the current-carrying capability of the power semiconductor element 11.

To this end, the charge pump circuit 12a includes a gate clamp section 17a as illustrated in FIG. 9. The gate clamp section 17a has the function as a switch which disables, upon receipt of a signal from the timer circuit 16, the third stage of the booster circuit 23, and includes an inverter 61 and a MOSFET 62.

The input of the inverter 61 is connected to the output of the timer circuit 16, and the output of the inverter 61 is connected to the gate of the MOSFET 62. The drain of the MOSFET 62 is connected to the output of the inverter 22, and the source of the MOSFET 62 is connected to the input of the inverter 32 of the third stage.

Thus, when the timer circuit 16 is activated, the signal of an L level is input to the inverter 61, and therefore the inverter 61 outputs the signal of an H level to turn on the MOSFET 62, thereby enabling the third stage of the booster circuit 23. Then, a signal boosted by the booster circuit 23 of the third stage is applied to the gate of the power semiconductor element 11, so that the power semiconductor element 11 may supply the rush current of the motor 2.

Next, when the signal of an H level is input to the inverter 61 from the timer circuit 16 which has timed out, the inverter 61 outputs the signal of an L level to turn off the MOSFET 62, thereby disabling the third stage of the booster circuit 23. Then, a signal boosted by the booster circuit 23 of the second stage is applied to the gate of the power semiconductor element 11, so that the power semiconductor element 11 may supply a current enough to maintain the operation of the motor 2.

Thus, the charge pump circuit 12a has a function similar to the function performed by the gate clamp circuit 17, so that even if a load is shorted when the motor 2 is operating, a current exceeding the peak value of the rush current will not flow in the power semiconductor element 11. Note that, in the semiconductor device 60 according to the third embodiment, because the gate clamp circuit 17 is not used in which a current constantly flows through the diode group 41 and MOSFET 42 in the operation of a motor after being activated, the power consumption may be reduced further than in the semiconductor device 10.

Figure 10:
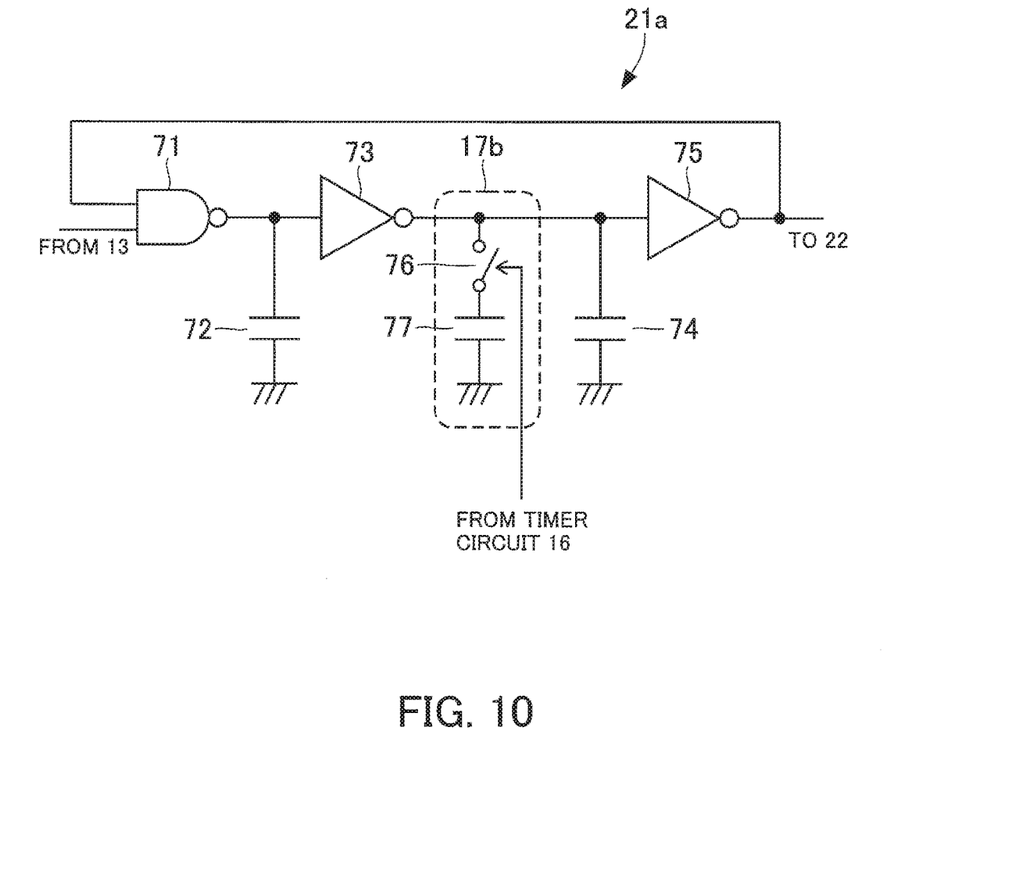
FIG. 10 is a circuit diagram illustrating an example of an oscillation circuit constituting a charge pump circuit of a semiconductor device according to a fourth embodiment.

FIG. 10 is a circuit diagram illustrating an example of an oscillation circuit constituting the charge pump circuit of a semiconductor device according to a fourth embodiment.

The semiconductor device according to the fourth embodiment has a configuration similar to the semiconductor device 60 illustrated in FIG. 8, but the method for realizing the gate clamp section 17a differs from that illustrated in FIG. 9. That is, the charge pump circuit 12a of FIG. 8 reduces the capability of the charge pump by reducing the number of stages of the booster circuit 23, while in the semiconductor device according to the fourth embodiment, the capability of the charge pump is reduced by reduction in the oscillation frequency of the oscillation circuit 21. Accordingly, in the semiconductor device 60 illustrated in FIG. 8, the charge pump circuit 12a has the same configuration as the charge pump circuit 12 illustrated in FIG. 2 and the oscillation circuit 21 is constituted by an oscillation circuit 21a illustrated in FIG. 10.

The oscillation circuit 21a includes a NAND circuit 71, capacitors 72 and 74, inverters 73 and 75, and a gate clamp section 17b. The gate clamp section 17b includes a switch 76 and a capacitor 77.

The gate clamp section 17b is constituted by serial connection of the switch 76 and capacitor 77. The switch 76 is an element, which is switched by a signal from the timer circuit 16, and is constituted, for example, by a MOSFET or the like. One terminal of the switch 76 is connected to one terminal of the capacitor 74, the other terminal of the switch 76 is connected to one terminal of the capacitor 77, and the other terminal of the capacitor 77 is connected to the other terminal of the capacitor 74. Accordingly, the gate clamp section 17b may connect, by a signal from the timer circuit 16, the capacitor 77 in parallel with the capacitor 74 so as to change the capacitance of the capacitor 74.

The output of the NAND circuit 71 is connected to one terminal of the capacitor 72 and the input of the inverter 73, respectively, and the other terminal of the capacitor 72 is connected to the terminal GND of the semiconductor device. The output of the inverter 73 is connected to one terminal of the switch 76 of the gate clamp section 17b, one terminal of the capacitor 74, and the input of the inverter 75, respectively. The other terminal of the capacitor 77 of the gate clamp section 17b and the other terminal of the capacitor 74 are connected to the terminal GND of the semiconductor device. The output of the inverter 75 constitutes the output of the oscillation circuit 21a and is connected to one terminal of the NAND circuit 71, and the other terminal of the NAND circuit 71 is connected to the output of the control circuit 13.

The NAND circuit 71 outputs, upon receipt of the signal of an L level input at the other terminal, the signal of an H level, and outputs, upon receipt of the signal of an H level, a signal obtained by inverting the logic level of a signal input to one terminal of the NAND circuit 71. Therefore, the oscillation circuit 21a constitutes a ring oscillator by connecting in a ring the inverter function of the NAND circuit 71 and the inverters 73 and 75. The oscillation frequency of the oscillation circuit 21a is determined by the capacitance values of capacitors 72 and 74 arranged at the outputs of the NAND circuit 71 and inverter 73, respectively, and the oscillation circuit 21a oscillates, when the motor is activated, at a frequency determined by the capacitance values of the capacitors 72 and 74. In the operation of the motor after being activated, the oscillation frequency of the oscillation circuit 21a is reduced by increase in the capacitance of the capacitor 74 by the capacitance value of the capacitor 74 of the gate clamp section 17b, thereby reducing the number of times of pumping of the charge pump to reduce the capability of the charge pump.

In the above embodiments, the application to a high-side IPS has been described, but the embodiments discussed herein may be also applicable in a similar manner to a low-side IPS which does not have the charge pump. Moreover, one chip or one package of the power semiconductor element 11 and its peripheral driver circuit has been described as the semiconductor device, but the embodiments discussed herein may be also applicable in a similar manner to a driver circuit excluding the power semiconductor element 11.

The semiconductor device of the above-described configuration has an advantage that the short-circuit current when a load is shorted may be reduced because the current-carrying capability of a power semiconductor element is reduced after a certain time since the current starts to flow in the power semiconductor element. Thus, because there is no abrupt increase in temperature of the power semiconductor element due to the short-circuit current, burnout of the power semiconductor element and a substrate wiring may be prevented and also the malfunction of a peripheral device due to the fluctuation of the power-supply voltage may be prevented and high reliability may be accordingly secured. Furthermore, because the current-carrying capability of the power semiconductor element is not reduced when a rush current flows, a wasteful heat generation of the power semiconductor element may be prevented.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising
a driver circuit configured to drive a power semiconductor element, the driver circuit including:
a gate clamp circuit configured to clamp a gate voltage of the power semiconductor element;
a timer circuit configured to start counting when a current starts flowing in the power semiconductor element; and
an extracting transistor having a first terminal connected to a gate of the semiconductor element and having a second terminal connected to a terminal of the semiconductor element and an output of the gate clamp circuit, the extracting transistor configured to be controlled to reduce a switching time of the semiconductor element,
wherein the timer circuit is configured to operate the gate clamp circuit after a certain time from the start of the counting of the timer circuit so as to reduce current-carrying capability of the power semiconductor element.

2. The semiconductor device according to claim 1, wherein the certain time is set to correspond to a duration of a rush current, such that the certain time is set to extend past an end of the duration of the rush current.

3. The semiconductor device according to claim 2, wherein the driver circuit further includes a booster circuit configured to generate the gate voltage when the power semiconductor element is turned on.

4. The semiconductor device according to claim 3, wherein the booster circuit is a charge pump circuit.

5. The semiconductor device according to claim 4, wherein the charge pump circuit includes an oscillator and a multi-stage booster section configured to output the gate voltage that is boosted by a switching operation by an oscillation signal of the oscillator.

6. The semiconductor device according to claim 5, wherein the gate clamp circuit is a circuit configured to reduce the gate voltage by reducing a number of stages of the multi-stage booster section based on a signal from the timer circuit.

7. The semiconductor device according to claim 5, wherein the gate clamp circuit is a circuit configured to reduce the gate voltage by reducing an oscillation frequency of the oscillator based on a signal from the timer circuit.

8. The semiconductor device according to claim 1 integrally comprising the power semiconductor element together with the driver circuit.

9. The semiconductor device according to claim 1, wherein the gate clamp circuit comprises a transistor, an output of the timer circuit is connected to a gate of the transistor of the gate clamp circuit, and the timer circuit is configured to operate the gate clamp circuit by asserting a signal at the gate of the transistor of the gate clamp circuit after the certain time from the start of the counting of the timer circuit.

10. The semiconductor device according to claim 9, wherein the gate clamp circuit further comprises a plurality of diodes connected in series, wherein one terminal of the transistor of the gate clamp circuit is connected to an end of one of the diodes among the plurality of diodes, and another terminal of the transistor is connected to an output terminal of the semiconductor device.

11. The semiconductor element according to claim 7, wherein the oscillator comprises a plurality of inverters connected in series, one terminal of the transistor of the gate clamp circuit is connected between two of the plurality of transistors, and another terminal of the transistor of the gate clamp circuit is connected to ground.

* * * * *